United States Patent [19]
Dijkmans

[11] Patent Number: 5,821,828
[45] Date of Patent: Oct. 13, 1998

[54] AN OSCILLATOR HAVING A VOLTAGE CONTROLLED AMPLITUDE

[75] Inventor: Eise C. Dijkmans, Eindhoven, Netherlands

[73] Assignee: U.S. Philips Corporation, New York, N.Y.

[21] Appl. No.: 902,046

[22] Filed: Jul. 29, 1997

[30] Foreign Application Priority Data

Aug. 7, 1996 [EP] European Pat. Off. ............. 96202212

[51] Int. Cl.⁶ .................................................. H03B 5/36
[52] U.S. Cl. ................................. 331/109; 331/116 FE; 331/158; 331/182
[58] Field of Search .................................. 331/109, 114, 331/116 R, 116 FE, 117 R, 117 FE, 117 D, 108 A, 108 C, 158, 182

[56] References Cited

U.S. PATENT DOCUMENTS 4,360,789  11/1982  Lewyn et al. ........................... 331/109
5,113,156   5/1992  Mahabadi et al. ...................... 331/109

*Primary Examiner*—David Mis
*Attorney, Agent, or Firm*—Steven R. Biren

[57] ABSTRACT

An oscillator provided with an amplitude controller (AMPREG1) which is coupled by an input (G1) to an amplitude reference terminal (AMPREF1). The amplitude of the oscillator signal at the output terminal (KU) can be adjusted through coupling of a voltage-generating means to the amplitude reference terminal (AMPREF1).

20 Claims, 2 Drawing Sheets

AN OSCILLATOR HAVING A VOLTAGE CONTROLLED AMPLITUDE

BACKGROUND OF THE INVENTION

1. Field of the Invention

The invention relates to an oscillator comprising an amplifier which comprises a first and a second supply terminal; an amplification transistor with a first main electrode coupled to an output terminal, a second main electrode coupled to the first supply terminal, and a control electrode coupled to an input terminal; and an amplitude controller.

2. Description of Related Art

Such an oscillator is known from U.S. Pat. No. 4,360,789. An oscillator is described therein with an amplitude controller with which the current consumption of the amplifier, and thus also of the oscillator, is minimized.

It is a disadvantage of the known oscillator that the amplitude controller comprises comparatively many components.

A further disadvantage of the known oscillator is that the amplitude of the oscillator signal at the output terminal is not adjustable.

SUMMARY OF THE INVENTION

It is an object of the invention to provide an oscillator with an amplitude controller which does away with the above disadvantages.

An oscillator according to the invention is for this purpose characterized in that the amplitude controller in addition comprises an amplitude reference terminal for receiving a reference signal by means of which the amplitude of the oscillator signal at the output terminal is defined; a first transistor with a first main electrode, a second main electrode coupled to the output terminal, and a control electrode coupled to the amplitude reference terminal; a second transistor with a first main electrode coupled to the first main electrode of the first transistor, a second main electrode coupled to the input terminal, and a control electrode; and a bias capacitor coupled between the output terminal and the control electrode of the second transistor.

The amplitude of the output signal at the output terminal can be controlled by means of voltage-generating means coupled to the amplitude reference terminal. If the amplifier of the oscillator is in addition fitted with a further amplification transistor for increasing the transconductance of the amplifier, the oscillator may comprise a further amplitude controller. The further amplitude controller may be constructed in a manner corresponding to that of the amplitude controller. If the further amplitude controller is controlled by further voltage-generating means coupled to a further amplitude reference terminal, the positive and the negative peaks of the output signal at the output terminal can be separately controlled. If so desired, the further voltage-generating means and the further amplitude reference terminal may be absent. In that case the further amplitude controller should be coupled to the amplitude reference terminal. Both the positive and the negative peaks of the output signal at the output terminal are controlled by the voltage-generating means in that construction.

An embodiment of an oscillator with an amplitude controller according to the invention is characterized in that the oscillator in addition comprises a starting circuit for safeguarding starting of the oscillator, which circuit limits the potential at the input terminal. The starting circuit may be provided with a differential pair comprising a third transistor with a first main electrode coupled to the input terminal, a second main electrode coupled to current-generating means, and a control electrode coupled to a reference terminal, and a fourth transistor with a first main electrode coupled to the first supply terminal, a second main electrode coupled to the second main electrode of the third transistor, and a control electrode coupled to a common junction point.

BRIEF DESCRIPTION OF THE DRAWINGS

The invention will be explained in more detail with reference to the accompanying drawing, in which.

DETAILED DESCRIPTION OF THE PREFERRED EMBODIMENTS

The same components or elements have been given the same reference symbols in these Figures. The transistors are constructed as field effect transistors here, by way of example, the drains, sources, and gates corresponding to the first main electrodes, the second main electrodes and the control electrodes, respectively. The transistors may alternatively be bipolar transistors. Instead of the conductivity types indicated, the transistors may alternatively be given the opposite conductivity types. A combination of bipolar transistors and field effect transistors is also possible. The polarities of voltage-generating or current-generating means are to be adapted as required. The oscillator may be realized in an integrated circuit as well as by means of discrete components.

Figure 1:
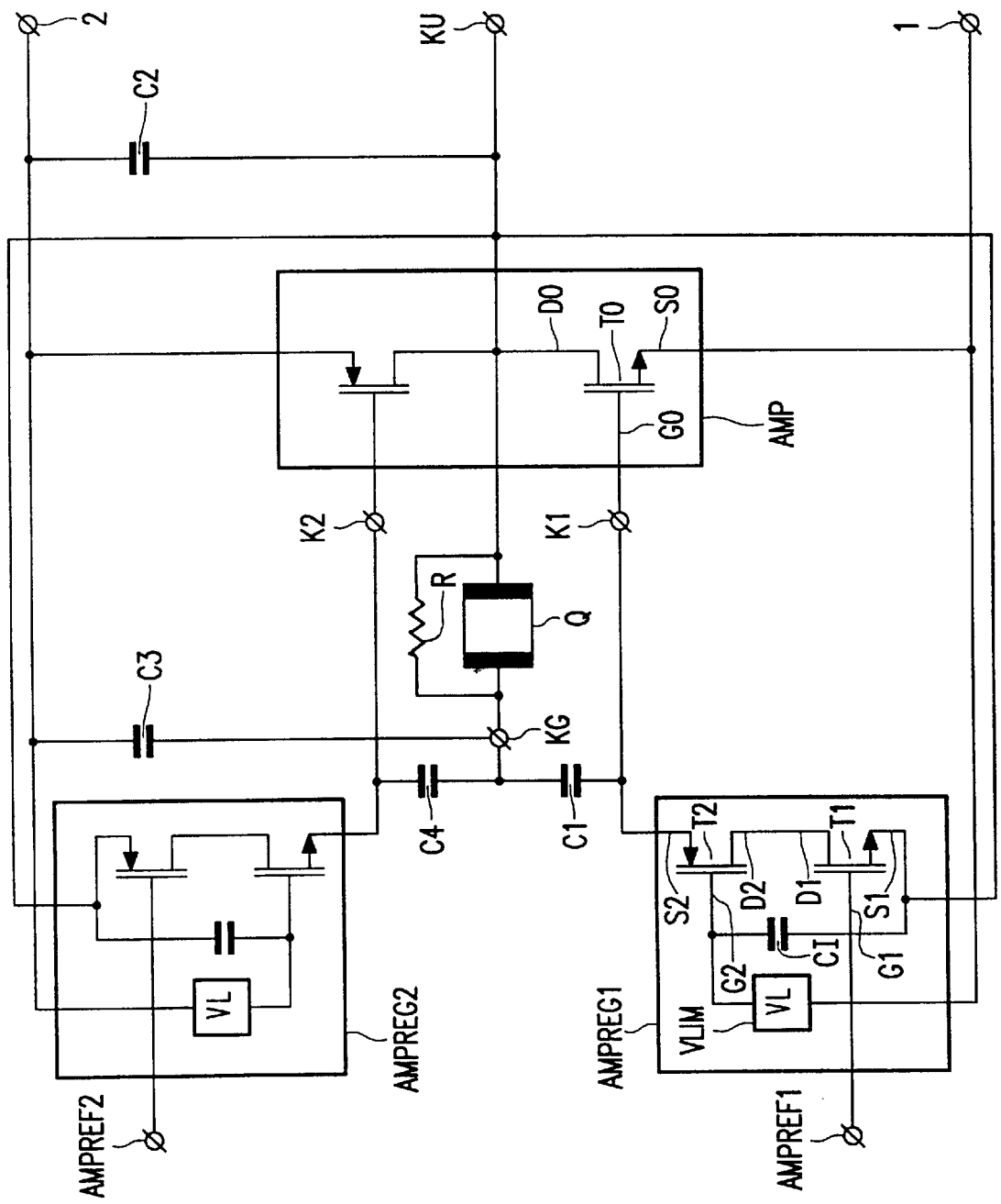
FIG. 1 is a circuit diagram of an embodiment of an oscillator with an amplitude controller according to the invention.

FIG. 1 shows an embodiment of an oscillator with an amplitude controller AMPREG1 according to the invention. The oscillator comprises an amplifier AMP comprising a first and a second supply terminal 1, 2, an amplification transistor T0 with its drain D0 coupled to an output terminal KU, its source S0 coupled to the first supply terminal 1, and its gate G0 coupled to an input terminal K1; a resonator Q coupled between the output terminal KU and a common terminal KG; a first capacitor C1 coupled between the input terminal K1 and the common terminal KG; a second capacitor C2 coupled between the output terminal KU and the second supply terminal 2; a third capacitor C3 coupled between the common terminal KG and the second supply terminal 2; and amplitude controller AMPREG1 comprising a first transistor T1 with its source S1 coupled to the output terminal KU and its gate G1 coupled to an amplitude reference terminal AMPREF1; a second transistor T2 with its drain D2 coupled to the drain D1 of the first transistor T1 and its source S2 coupled to the input terminal K1; a bias capacitor CI coupled between the output terminal KU and the gate G2 of the second transistor T2; and a voltage limiter VLIM coupled between the first supply terminal 1 and the gate G2 of the second transistor T2.

The series arrangement of the resonator Q and the first capacitor C1 forms a feedback path which together with the amplifier AMP forms a closed loop. The resonator Q is often constructed with a quartz crystal. The second and third capacitors C2 and C3 serve as phase-shifting, elements, with the result that the frequency of the oscillator is substantially equal to the resonance frequency of the resonator. If the resonator Q is fitted with a quartz crystal, the resistance losses of the quartz crystal may be so high during starting of the oscillator that the feedback path is not efficient enough.

It may be necessary for this reason to connect a resistive element R parallel to the quartz crystal. This resistive element R may be provided, for example, with a resistor or with a diode. It is also possible to couple the resistive element R between the output terminal KU and the input terminal K1.

The operation of the amplitude controller AMPREG1 is as follows. It is assumed by way of example that: the potential at the second supply terminal 2 is higher than the potential at the first supply terminal 1; the amplification transistor T0 and the first transistor T1 are N-type field effect transistors; and the second transistor T2 is a P-type field effect transistor. The amplitude of the negative half of the oscillator signal at the output terminal KU can be controlled via the amplitude controller AMPREG 1 by means of a voltage-generating means which supplies a voltage to the amplitude reference terminal AMPREF1. When the potential at the output terminal KU is lower than the potential at the, amplitude reference terminal AMPREF1 by more than a threshold voltage VT1 of the first transistor T1, this first transistor T1 will become conducting, so that a current will flow from the input terminal K1 through the second and first transistors T2 and T1 to the output terminal KU. The potential at the input terminal K1 drops as a result of this, so that the current through the amplification transistor T0 is reduced. The potential at the output terminal KU rises as a result until the potential at the output terminal KU has become so high that the potential difference between the amplitude reference terminal AMPREF1 and the output terminal KU is equal to the threshold voltage VT1 of the first transistor T1. A small current flows through the first and the second transistor T1 and T2 during the negative peaks only of the output signal at the output terminal KU; thus the amplitude controller AMPREG1 is actively controlling during the negative peaks of the output signal. Since the second transistor T2 must be conducting during the negative peaks of the output signal, it is necessary for the potential at the gate G2 to be lower than the potential at the source S2 by at least a threshold voltage VT2 of the second transistor T2 during the negative peaks. This is achieved through a coupling of the gate G2 to the output terminal KU via the bias capacitor CI. A sufficiently great potential difference is present between the source S2 and the gate G2 of the second transistor T2 during the negative peaks of the signal at the output terminal KU because the signal at the output terminal KU is in counterphase with the signal at the common terminal KG, with the result that the second transistor 12 is conducting.

The voltage limiter VLIM limits the signal voltage at the gate G2 of the second transistor T2, which prevents the source and drain functions of the second transistor T2 from being interchanged, which could lead to a current flowing from the output terminal KU through the first and second transistors T1 and T2 to the input terminal K1.

Figure 2:
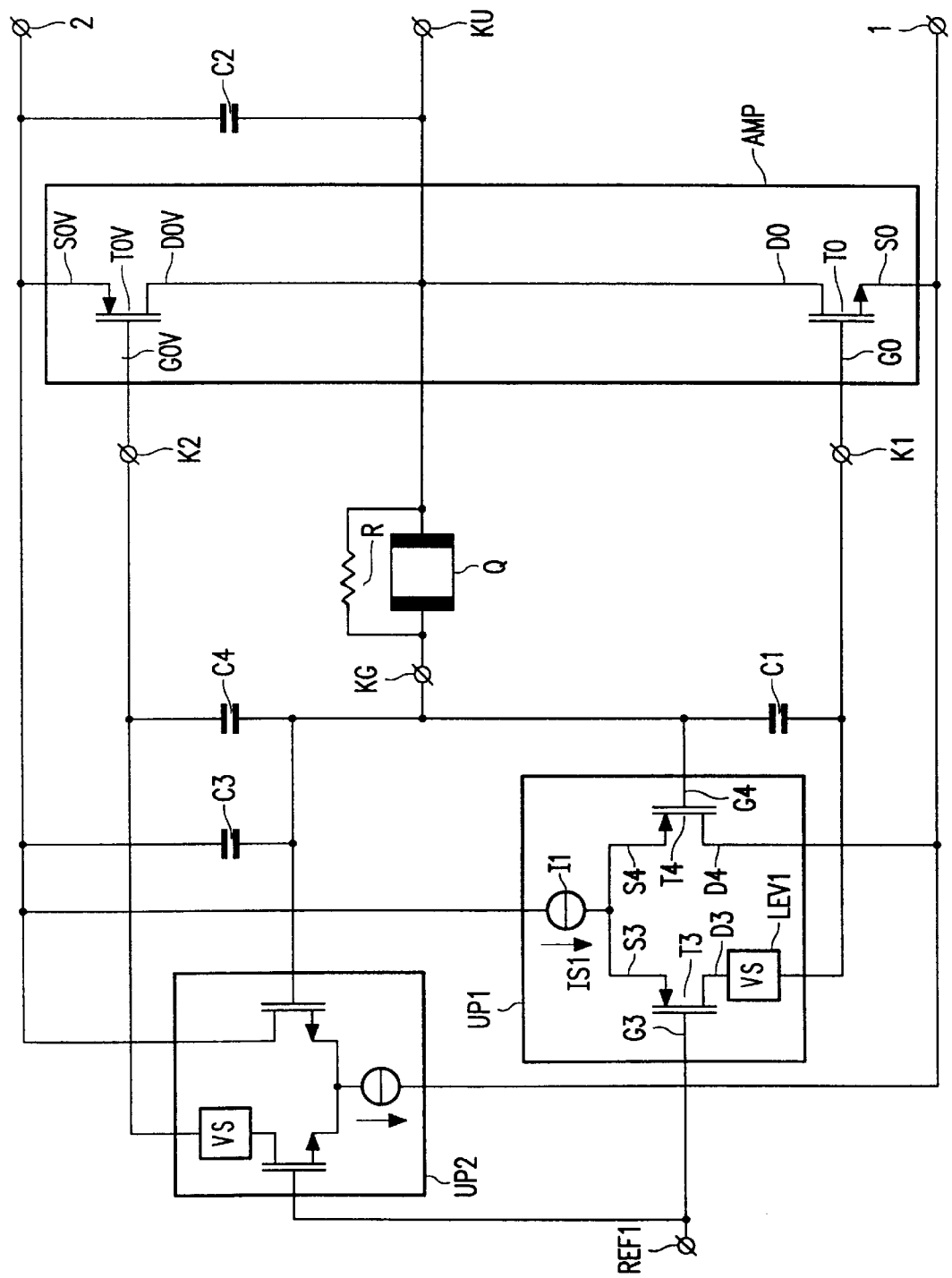
FIG. 2 is a circuit diagram of an embodiment of an oscillator with a starting circuit according to the invention.

FIG. 2 shows an embodiment of an oscillator with a starting circuit UP1 according to the invention. A current-generating means or current source I1 is coupled to the gate G0 of the amplification transistor T0 for starting the oscillator, as is usual. It may nevertheless occur that the oscillator fails to start. This is due to the following phenomenon. The current source I1 progressively charges the gate-source capacitance of the amplification transistor T0, so that an increasing voltage difference arises between the gate G0 and the source S0. This results in an increasing conductance of the amplification transistor T0 while also the transconductance of the amplification transistor T0 rises further. At the same time, the voltage difference between the drain D0 and the source S0 will progressively decrease. The voltage difference between the drain D0 and the source S0 has become so small at a given moment that the amplification transistor T0 is no longer in the saturated state, so that the transconductance of the amplification transistor T0 drops steeply. If the oscillator had not yet started at this given moment, the oscillator will be incapable of starting because of an insufficient transconductance of the amplification transistor T0.

To ensure starting of the oscillator, the starting circuit UP1 in addition comprises a differential pair T3, T4 comprising a third transistor T3 with its drain D3 coupled to the input terminal K1, its source S3 coupled to the current source I1, and its gate G3 coupled to a reference terminal REF1, and a fourth transistor T4 with its drain D4 coupled to the first supply terminal 1, its source S4 coupled to the source S3 of the third transistor T3, and its gate G4 coupled to the common terminal KG. In addition, a voltage level shifter LEV1 may be connected in series with the drain D3 of the third transistor T3.

The starting circuit UP1 operates as follows. A voltage-generating means gives a potential to the reference terminal REF1. This potential is preferably equal to half the potential of the second supply terminal 2. Initially a certain portion of a current IS1 supplied by the current source I1 will flow through the third transistor T3. The combination of the differential pair UP1, the amplifier AMP, and the parallel arrangement of the quartz crystal Q and the resistive element R forms a negative feedback control loop, as a result of which the potential at the gate G4 of the fourth transistor T4 becomes substantially equal to the potential at the reference terminal REF1. Accordingly, half the current IS1 flows through the third transistor T3, so that the gate-source capacitance of the amplification transistor T0 is progressively charged, and the amplification transistor T0 becomes progressively conducting. The voltage difference between the source S3 and the drain D3 of the third transistor T3 decreases continuously until the third transistor T3 is no longer in the saturated state. The current flowing through the third transistor T3 decreases continuously as a result of this. The gate-source capacitance of the amplification transistor T0 will not, or substantially not be charged further as a result of this. Given a suitable dimensioning of the voltage level shifter, LEV1, the third transistor T3 will leave the saturated state before the amplification transistor T0 will leave the saturated state. This safeguards starting of the oscillator.

While the oscillator is oscillating, the current IS1 flows alternately through the third and fourth transistors T3 and T4. The negative feedback control loop UP, AMP, Q, R renders the DC voltage components of the potentials at the common junction KG and the output terminal KU equal to the potential at the reference terminal REF1.

If the oscillator is constructed with a further amplification transistor T0V coupled by its drain D0V to the output terminal KU; by its source S0V to the second supply terminal 2; and by its gate G0V to a further input terminal K2, the oscillator must furthermore comprise a further starting circuit UP2 and a fourth capacitor C4 connected between the common terminal KG and the further input terminal K2 so as to ensure starting of the oscillator. The further starting circuit UP2 can be constructed in a manner similar to that of the starting circuit UP1.

I claim:

1. An oscillator comprising an amplifier which comprises:
    a first and a second supply terminal,
    an amplification transistor with
        a first main electrode coupled to an output terminal, a second main electrode coupled to the first supply terminal, and a control electrode coupled to an input terminal; and an amplitude controller, characterized in that the amplitude controller comprises;

amplitude reference terminal for receiving a reference signal by means of which the amplitude of the oscillator signal at the output terminal is determined;

a first transistor with
    a first main electrode,
    a second main electrode coupled to the output terminal, and
    a control electrode coupled to the amplitude reference terminal;

a second transistor with
    a first main electrode coupled to the first main electrode of the first transistor,
    a second main electrode coupled to the input terminal, and
    a control electrode; and a bias capacitor coupled between the output terminal and the control electrode of the second transistor.

2. An oscillator as claimed in claim 1, characterized in that the amplitude controller in addition comprises a voltage limiter for limiting the potential at the control electrode of the second transistor.

3. An oscillator as claimed in claim 1, characterized in that the amplification transistor and the first transistor are of the same conductivity type which is opposed to the conductivity type of the second transistor (T2).

4. An oscillator as claimed in claim 1, characterized in that the oscillator in addition comprises a starting circuit for safeguarding starting of the oscillator.

5. An oscillator as claimed in claim 4, characterized in that the starting circuit limits the potential at the input terminal.

6. An oscillator as claimed in claim 4, characterized in that the starting circuit limits the potential at the input terminal by means of a measurement of the potential at the input terminal.

7. An oscillator as claimed in claim 6, characterized in that the starting circuit comprises:

a differential pair comprising:
    a third transistor with
        a first main electrode coupled to the input terminal,
        a second main electrode coupled to a current-generating means, and
        a control electrode coupled to a reference terminal, and
    a fourth transistor with
        a first main electrode coupled to the first supply terminal,
        a second main electrode coupled to the second main electrode of the third transistor, and
        a control electrode coupled to a common terminal.

8. An oscillator as claimed in claim 7, characterized in that a voltage level shifter is connected in series with the first main electrode of the third transistor.

9. An oscillator as claimed in claim 2, characterized in that the amplification transistor and the first transistor are of the same conductivity type which is opposed to the conductivity type of the second transistor.

10. An oscillator as claimed in claim 2, characterized in that the oscillator in addition comprises a starting circuit for safeguarding starting of the oscillator.

11. An oscillator as claimed in claim 3, characterized in that the oscillator in addition comprises a starting circuit for safeguarding starting of the oscillator.

12. An oscillator as claimed in claim 9, characterized in that the oscillator in addition comprises a starting circuit for safeguarding starting of the oscillator.

13. An oscillator as claimed in claim 10, characterized in that the starting circuit limits the potential at the input terminal.

14. An oscillator as claimed in claim 12, characterized in that the starting circuit limits the potential at the input terminal.

15. An oscillator as claimed in claim 10, characterized in that the starting circuit limits the potential at the input terminal by means of a measurement of the potential at the input terminal.

16. An oscillator as claimed in claim 12, characterized in that the starting circuit limits the potential at the input terminal by means of a measurement of the potential at the input terminal.

17. An oscillator as claimed in claim 15, characterized in that the starting circuit comprises:

a differential pair comprising:
    a third transistor with
        a first main electrode coupled to the input terminal,
        a second main electrode coupled to a current-generating means, and
        a control electrode coupled to a reference terminal, and
    a fourth transistor with
        a first main electrode coupled to the first supply terminal,
        a second main electrode coupled to the second main electrode of the third transistor, and
        a control electrode coupled to a common terminal.

18. An oscillator as claimed in claim 16, characterized in that the starting circuit comprises:

a differential pair comprising:
    a third transistor with
        a first main electrode coupled to the input terminal,
        a second main electrode coupled to a current-generating means, and
        a control electrode coupled to a reference terminal, and
    a fourth transistor with
        a first main electrode coupled to the first supply terminal,
        a second main electrode coupled to the second main electrode of the third transistor, and
        a control electrode coupled to a common terminal.

19. An oscillator as claimed in claim 17, characterized in that a voltage level shifter is connected in series with the first main electrode of the third transistor.

20. An oscillator as claimed in claim 18, characterized in that a voltage level shifter is connected in series with the first main electrode of the third transistor.

* * * * *